US010797452B2

(12) United States Patent  
Bouchard et al.

(10) Patent No.: US 10,797,452 B2  
(45) Date of Patent: Oct. 6, 2020

(54) ELECTRICAL DEVICE AND GROUNDING METHOD FOR SUCH A DEVICE

(71) Applicant: Schneider Electric Industries SAS, Rueil-Malmaison (FR)

(72) Inventors: Jean-Luc Bouchard, Grenoble (FR); Konstantin Filippenko, Grenoble (FR); Stephane Lacroix, Challes les Eaux (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 0 days.

(21) Appl. No.: 16/358,763

(22) Filed: Mar. 20, 2019

(65) Prior Publication Data

US 2019/0296508 A1 Sep. 26, 2019

(30) Foreign Application Priority Data

Mar. 23, 2018 (FR) ...................................... 18 52538

(51) Int. Cl.
*H01R 25/14* (2006.01)
*H05K 5/00* (2006.01)
(Continued)

(52) U.S. Cl.
CPC ......... *H01R 25/142* (2013.01); *H01R 9/2691* (2013.01); *H02B 1/16* (2013.01);
(Continued)

(58) Field of Classification Search
CPC .. H05K 5/0017; H05K 5/0247; H05K 5/0204; H05K 5/0073; H05K 7/1474; H01R 13/24; H01R 9/2691
(Continued)

(56) References Cited

U.S. PATENT DOCUMENTS 5,595,507 A * 1/1997 Braun ...................... H01R 4/64  
                                                                                                439/716  
5,615,079 A * 3/1997 Eggert ................. H01R 9/2675  
                                                                                                361/601
(Continued)

FOREIGN PATENT DOCUMENTS

DE       35 26 494 A1     1/1987  
DE       94 17 135 U1     2/1995  
(Continued)

OTHER PUBLICATIONS

French Preliminary Search Report dated Feb. 4, 2019 in French Application 18 52538, filed on Mar. 23, 2018 (with English Translation of Categories of cited documents and Written Opinion).

*Primary Examiner* — Peter G Leigh  
(74) *Attorney, Agent, or Firm* — Oblon, McClelland, Maier & Neustadt, L.L.P.

(57) ABSTRACT

An electrical device includes a housing that is intended to be mounted on a rail, and a monitoring and/or control module including a printed circuit board. In the configuration in which the electrical device is mounted on the rail, at least one ground terminal of the printed circuit board is permanently electrically connected to the rail by elastic mechanical bearing on and direct electrical contact with a connecting element, itself elastically mechanically bearing on and making direct electrical contact with the rail or with an elastic blocking member for elastically blocking the housing on the rail.

9 Claims, 5 Drawing Sheets

(51) Int. Cl.
  *H05K 5/02* (2006.01)
  *H01R 9/26* (2006.01)
  *H02B 1/16* (2006.01)
  *H05K 7/14* (2006.01)
  *H02B 1/052* (2006.01)
  *H01R 13/24* (2006.01)

(52) U.S. Cl.
  CPC ......... *H05K 5/0017* (2013.01); *H05K 5/0073* (2013.01); *H05K 5/0204* (2013.01); *H05K 5/0247* (2013.01); *H05K 7/1474* (2013.01); *H01R 13/24* (2013.01); *H02B 1/052* (2013.01)

(58) Field of Classification Search
  USPC ........................................................... 439/94
  See application file for complete search history.

(56) References Cited

U.S. PATENT DOCUMENTS

| | | | | |
|---|---|---|---|---|
| 5,741,142 A * | 4/1998 | Dux | ...................... | H01R 9/2658 439/716 |
| 7,073,971 B2 * | 7/2006 | Schurr | ................... | H02B 1/052 403/325 |
| 8,727,797 B2 * | 5/2014 | Parrish | ................... | H02B 1/052 439/94 |
| 8,801,442 B2 * | 8/2014 | Quero | ...................... | H01R 9/03 174/541 |
| 2003/0123818 A1 * | 7/2003 | Watanabe | ............ | G02B 6/4201 385/92 |
| 2014/0017917 A1 | 1/2014 | Molnar | | |
| 2016/0295733 A1 | 10/2016 | Chiang | | |
| 2017/0219788 A1 * | 8/2017 | Zbinden | ............... | H04B 10/803 |

FOREIGN PATENT DOCUMENTS

| | | | | |
|---|---|---|---|---|
| DE | 102 49 981 B3 | 4/2004 | | |
| DE | 10249981 B3 * | 4/2004 | .......... | H05K 7/1474 |
| EP | 2 685 564 A2 | 1/2014 | | |
| EP | 3 076 503 A1 | 10/2016 | | |
| FR | 2 786 941 A1 | 6/2000 | | |

* cited by examiner

ELECTRICAL DEVICE AND GROUNDING METHOD FOR SUCH A DEVICE

The invention deals with an electrical device such as a contactor which comprises, among other things, a monitoring and/or control module which includes a printed circuit board supporting electronic components.

These components have to be protected against the electromagnetic disturbances due to the environment, particularly in the case where currents of relatively high intensity pass through electrical conductors situated in the vicinity of the monitoring and/or control module.

In most of the known products, an earthing is performed by means of a specific terminal provided on the electrical device and a cable connecting this terminal to an earth connection, outside of this equipment. This cable is not incorporated in the product concerned and risks being damaged in the use of the electrical device.

Moreover, WO-A-2011/041413 discloses a controlled earthing of electrical equipment mounted on a DIN rail, by means of a rotary cam which controls a steel strip of rectangular section, in order to bring it selectively to bear against a part of a module to be earthed. The earthing results from a positive action of an operator who has to operate the cam. If the operator forgets to do this, the equipment is not earthed. Its operation may be affected, even hazardous.

EP-A-1 073 323 discloses, for its part, the principle of a metal fixing plate for fixing an electrical device onto a support rail. An elastic blocking member for elastically blocking this plate on the rail is provided. It is made of resin and does not participate in the earthing of a part of this device. The use of a full metal plate, arranged on the back of the component, induces a significant consumption of metal, which can be useful in the case where a heat dissipation function is sought, as in this prior art, but not in the absence of such a function.

EP-A-2 685 564 provides for a conductive tap to be welded onto a printed circuit board, in order to earth a part of this board. Given the vibrations to which an electrical device is subjected during its life, there is a risk of the weld being broken, hence a loss of ground contact. This risk is all the more marked for electrical contactors because of the vibrations resulting from their successive openings and closures.

The present invention aims to resolve these problems by proposing a novel electrical device structure in which an effective earthing is obtained, without the risk of being forgotten by a user, by virtue of means that are reliable and economical, and without the risk of a welded link being broken, which makes it possible to protect electronic components mounted on a printed circuit board of a monitoring and/or control module from the electromagnetic disturbances due to the environment of the electrical device.

To this end, the invention relates to an electrical device comprising a housing that is intended to be mounted on a rail and a monitoring and/or control module which includes a printed circuit board. According to the invention, in the configuration in which the electrical device is mounted on the rail, at least one ground terminal of the printed circuit board is permanently electrically connected to the rail by elastic mechanical bearing on and direct electrical contact with a connecting element, itself elastically mechanically bearing on and making direct electrical contact with the rail or with an elastic blocking member for elastically blocking the housing on the rail.

By virtue of the invention, the placement of the housing on the rail makes it possible to electrically connect the ground terminal of the printed circuit board with this rail which, in accordance with the current standards, is itself grounded. Thus, simply mounting the electrical device on the rail makes it possible to earth the corresponding terminal of the printed circuit board, with no specific intervention from the operator and without notably increasing the cost price of the electrical device according to the invention.

Within the meaning of the present invention, two parts are bearing against one another when they are in direct contact, without the interposition of an intermediate part. Furthermore, a part is conductive when it conducts a current, within the voltage and amperage range of use of the electrical device. Typically, a conductive part has a resistivity less than or equal to 0.20 $\Omega mm^2/m$.

Within the meaning of the invention, an electrical contact is direct when it occurs without the interposition of material between the two parts in contact.

According to aspects of the invention that are advantageous but not mandatory, such an electrical device can incorporate one or more of the following features, taken in any technically admissible combination:

- The connecting element between the ground terminal of the printed circuit board and the rail is a semi-rigid conductive clip composed of a metal wire conformed to electrically link this terminal and this rail.
- The semi-rigid conductive clip comprises a first portion elastically bearing against the ground terminal of the printed circuit board, this first portion comprising two branches which extend from a joining bend.
- The first elastic bearing portion is received and guided, parallel to its length, in a receptacle defined between the housing and the printed circuit board.
- The elastic blocking member is a spiral spring provided to come to bear against the rail, whereas the electrical connecting element is a conductive clip bearing, on the one hand, on the ground terminal and, on the other hand, on the spiral spring.
- The conductive clip is of a single piece and conformed to electrically link the ground terminal of the printed circuit board and the spiral spring.
- The conductive clip comprises a second portion elastically bearing on the spiral spring, this second portion comprising two branches which extend from a joining bend.
- The electrical connecting element is a semi-rigid conductive clip composed of a single-piece metal wire which comprises at least one first portion bearing against the ground terminal of the printed circuit board, a second portion engaging with the rail and a third portion providing the link between the first and second portions.
- The conductive clip is produced in a bronze wire with a cross section whose area lies between 0.5 and 4 $mm^2$.

According to another aspect, the invention targets a method for earthing a printed circuit board of a monitoring and/or control module of an electrical device which can be as mentioned above and which comprises a housing that is intended to be mounted on a rail. According to the invention, the earthing is effected simply by mounting the housing on the rail.

The invention will be better understood and other advantages thereof will become more clearly apparent in light of the following description, of two embodiments of an electrical device and of an earthing method conforming to its principle, given purely by way of example and with reference to the attached drawings in which.

Figure 1:
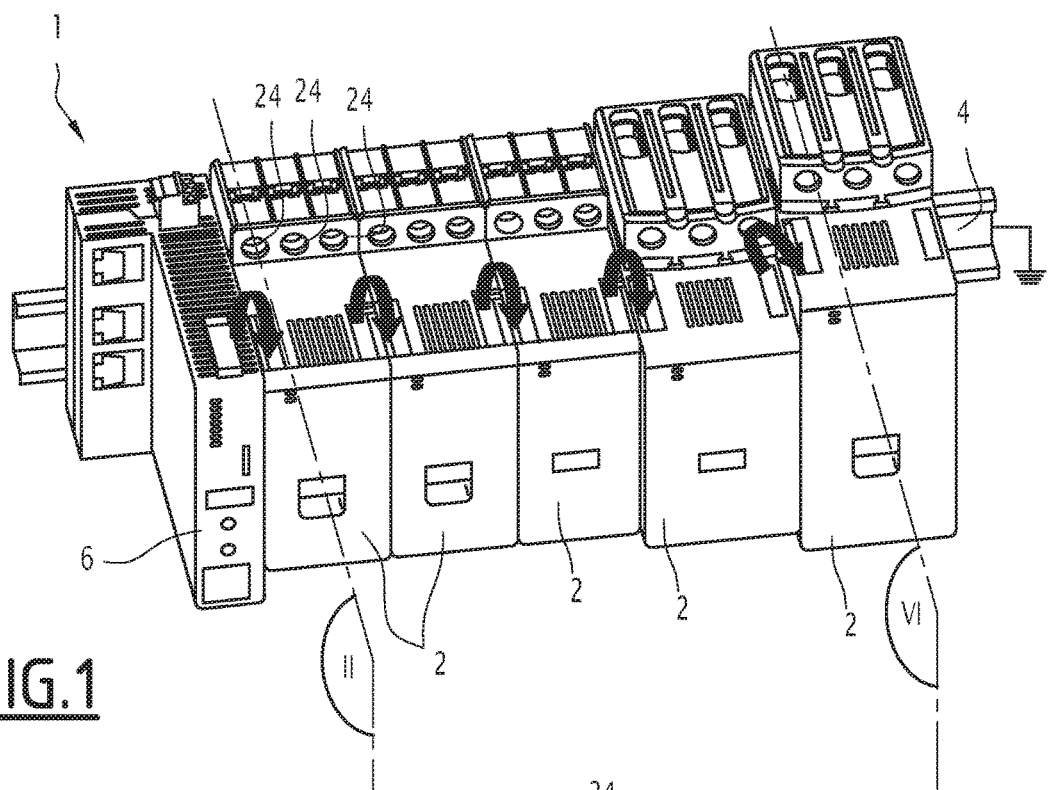
FIG. 1 is a perspective view of a part of an electrical installation comprising several electrical devices according to the invention.

The installation 1 partially represented in FIG. 1 comprises several motor ways 2, sometimes called "starters", which form these electrical devices mounted on a DIN rail 4. These devices 2 can be of several types, depending on the rated intensity of the current that they allow to pass.

The installation 1 also comprises a bus coupler 6. The devices 2 and 6 are linked to one another by a ribbon that is not represented of conductive wires which form a control bus for the equipment 2 and 6, this bus being represented by arrows in this FIG. 1. The ribbon of conductive control wires is partially visible in FIGS. 2, 3 and 7, with the reference 10.

The devices 2 can be of different types, depending on the maximum value of the current that they allow to pass or to disconnect. For example, in FIG. 1, the first two devices 2 starting from the left are contactors of a first model, making it possible to disconnect or to allow the passage of a current whose rated intensity lies between 0 and 45 amperes (A). The fifth device 2 starting from the left is a contactor of a second model, making it possible to disconnect or allow the passage of a current between 45 and 80 A. The third and fourth devices 2 starting from the left are measurement modules making it possible to indirectly control electrical loads. These third and fourth devices do not include any disconnecting member, or contactor or equivalent type. The third device 2 allows a current of 0 to 45 A to pass. The fourth device 2 can allow a current of 45 to 80 A to pass.

Figure 2:
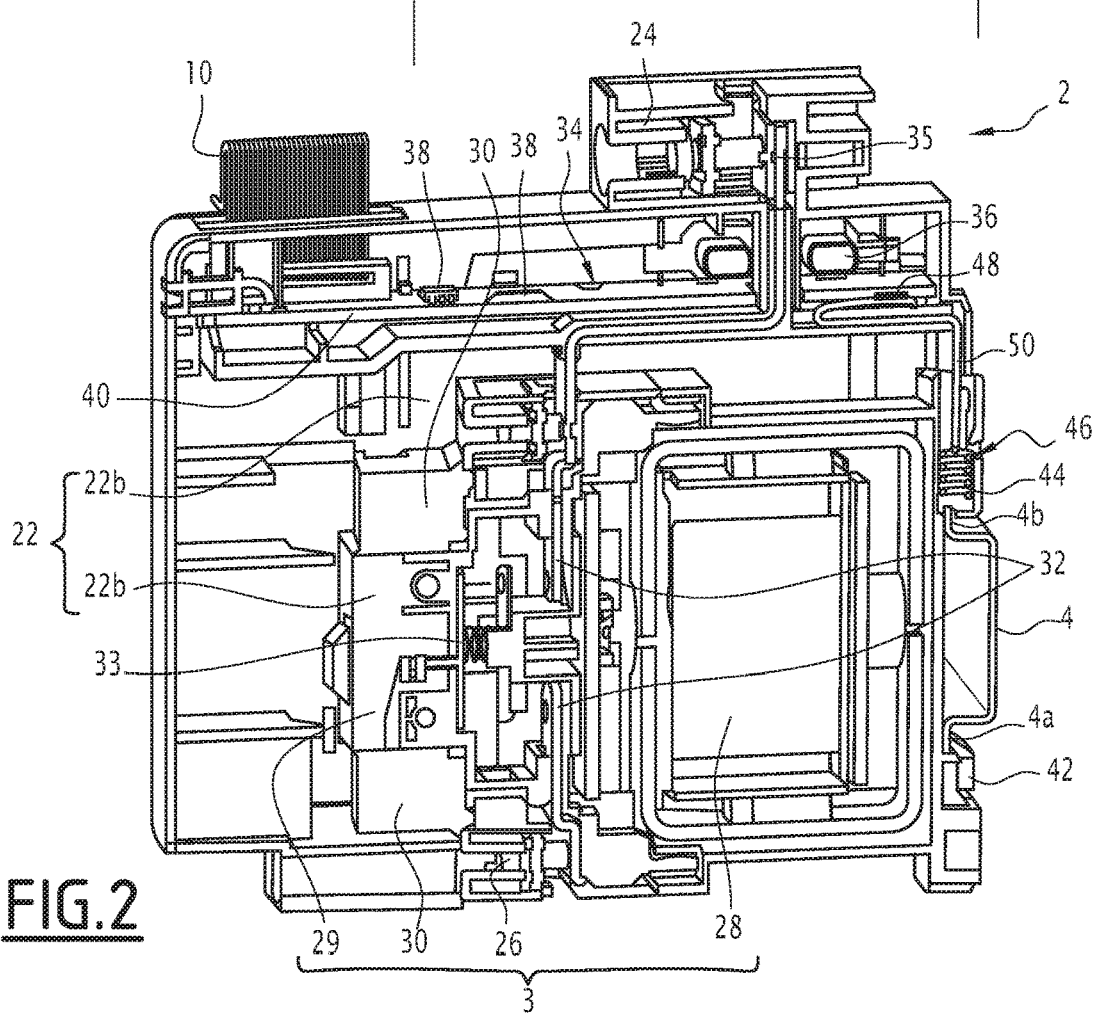
FIG. 2 is a perspective cross section of a contactor of this installation, along the plane II of FIG. 1.

As emerges from FIG. 2, the first motor way 2 starting from the left in FIG. 1 comprises a housing 22 made of electrically insulating material for the normal operating voltages and current of this device, for example made of thermoplastic synthetic material, in particular PA6.

The device 2 includes a contactor 3, which is a product that is known per se, and which comprises, on the one hand, an electromagnet 28 and, on the other hand, an insulating frame 29 in which three conductive lines circulate, only one of which is visible in FIG. 2, with the reference 32. This conductive line 32 also comprises an armature 33 that is mobile in the frame 29 under the action of the electromagnet 28. The electromagnet 28 simultaneously controls the displacement of the three armatures 33. Two terminals 30 are provided on the frame 29 for connecting power supply cables for the electromagnet 28, which are not represented.

The device 2 comprises three cable input terminals 24 situated in the upper part, as can be seen in FIGS. 1 and 2, and three output terminals, only one of which is visible in FIG. 2, with the reference 26. Each current line 32 extends between a terminal 24 and a terminal 26.

The electromagnet 28 and the conductive lines 32 are mounted in the housing 22. They make it possible to selectively interrupt an electrical link formed between the terminals 24 and 26, this electrical link comprising the conductive lines 32 of the frame 29 and connecting tabs which run in the housing 22, only one of which is visible in FIG. 2 with the reference 35.

The housing 22 also encloses a module 34 for monitoring a current circulating between the two terminals 24 and 26 of each current line 32 of the device 2. The module 34 controls the electromagnet 28 so as to selectively open and close the current lines 32 of the device 2 by displacement of the armatures 33. This module 34 comprises a Rogowski Torus 36 associated with various electronic components of which some can be seen in FIGS. 2 and 3 with the reference 38 and which comprise, among others, a microprocessor.

The components 38 are mounted on a printed circuit board 40, sometimes called PCB.

The board 40 is electrically linked to the terminals 30 of the contactor 3, by one or more electrical conductors that are not represented, in order to monitor the state of the electromagnet 28 and to control it.

In practice, the housing 22 is bipartite, with a first part 22a formed by the frame 29 and a second part 22b which encloses the monitoring module 34. These parts 22a and 22b are secured to one another by snap-fitting and screwing.

As a variant that is not represented, the part 22a of the housing 22 jackets the frame 29.

According to another variant that is not represented, the housing 22 is of a single piece.

The housing 22 is mounted on the rail 4 by a hook 42 formed on the rear of the part of the housing 22 formed by the frame 29, that is to say on the side opposite the front face of the contactor 22 which is visible in FIG. 1. The hook 42 engages with a first edge 4a of the rail 4, namely its bottom edge.

Moreover, two spiral springs 44 are mounted in the housing 22 and engage with a second edge 4b of the rail 4, namely its top edge. The two spiral springs 44 are received in receptacles 46 formed for this purpose on the back of the housing 22.

When the contactor 22 is mounted on the rail 4, the springs 44 are jammed behind the edge 4b against which they come to bear, which makes it possible to retain the contactor 2 in position on the rail 4.

The springs 44 can be elastically deformed when the contactor 2 is placed on the rail 4 or when it is removed. In other words, the springs 44 allow a reversible elastic snap-fitting of the contactor 2 onto the rail 4.

Since the rail 4 is earthed pursuant to the current standards, each spring 44 is also earthed when it is bearing against this rail, bearing in mind the fact that this spring 44 is made of metal, for example steel, therefore electrically conductive.

In order to avoid any external electromagnetic disturbances disturbing the operation of the electronic components 38 or of the Rogowski torus 36, at least one ground terminal 48 of the printed circuit board 40 is earthed by being electrically linked to the rail 4.

In practice, two earthing terminals of the printed circuit board 40 are electrically linked to the rail 4. This is not however mandatory and a single terminal 48 can be earthed in this way, depending on the size of the printed circuit board and on the number and the type of the components 38 that it supports.

For this, a clip 50 produced by a bronze wire is incorporated in the housing 22 to come to bear, on the one hand, against a ground terminal 48 and, on the other hand, against a spring 44. As many clips 50 are provided as there are ground terminals 48 to be linked to the rail 4. These clips are identical.

Figure 5:
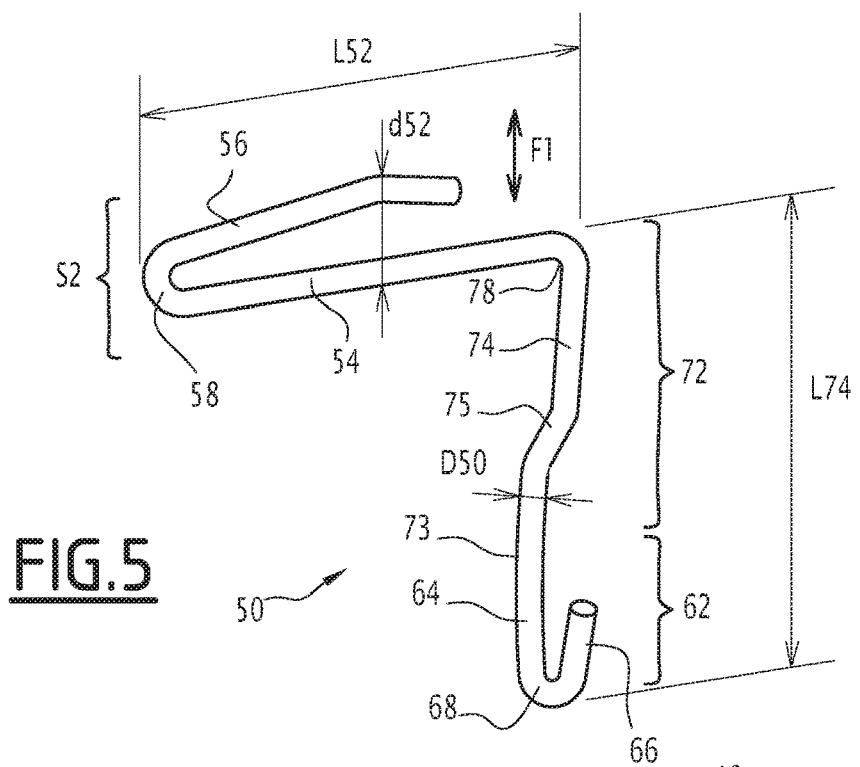
FIG. 5 is a perspective view of an electrical contact member used in the electrical device of FIGS. 2 to 4.

A clip 50 is visible only in perspective in FIG. 5. It is produced by a bronze wire conformed with a geometry suited to its function, which has a circular section whose diameter D50 lies between 0.5 mm and 2 mm. In practice, the bronze wire used to constitute the clip 50 can have a section other than circular. In all cases, the section of this wire has an area lying between 0.5 mm$^2$ and 4 mm$^2$.

As a variant, the metal wire used to constitute the clip 50 can be produced in a material other than bronze, for example copper-plated steel, copper, brass or any other copper alloy materials.

Whatever the material used, the metal wire constituting the clip 50 is semi-rigid, in as much as it can be conformed to assume the geometry represented in FIG. 5, while being elastically deformable in order to be adapted to its environment, in particular to the position and to the geometry of the parts against which it bears.

The clip 50 comprises a first portion 52 elastically mechanically bearing against the ground terminal 48. The first portion 52 is formed by a rectilinear first branch 54 and a bent second branch 56 opposite the branch 54. The branches 54 and 56 are linked by a joining bend 58 which can be elastically deformed, which gives the branch 56 a possibility of moving toward/away from the branch 54, as represented by the double arrow F1 in FIG. 5.

The branches 54 and 56 extend diverging away from one another from the bend 58 which defines an angle lying between 150 and 175°. When the clip 50 is mounted in the housing 22, the ground terminal is elastically mechanically bearing on and making direct electrical contact with the first portion 52 of the clip 50.

Figure 3:
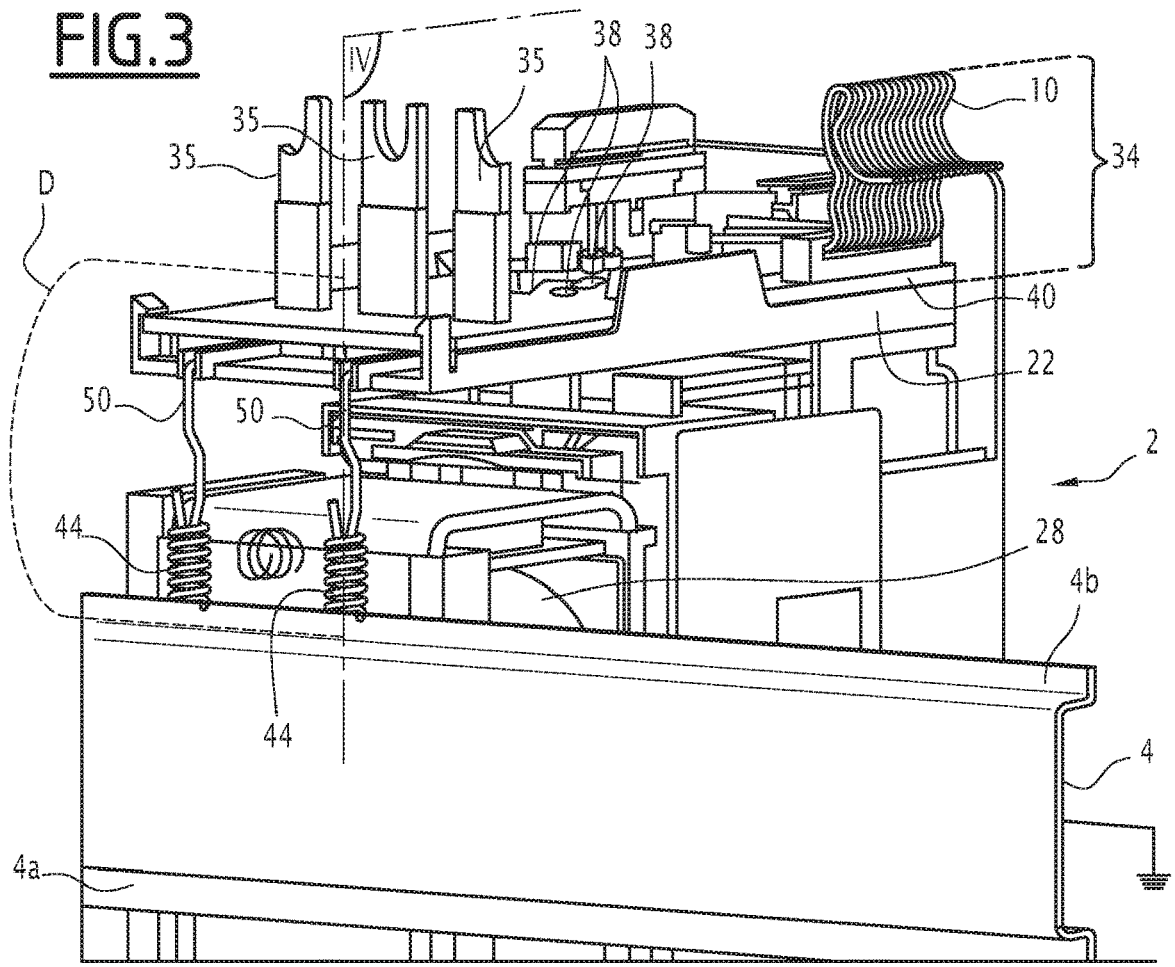
FIG. 3 is a partial perspective view, from another angle and from the rear, of the module represented in cross section in FIG. 2, whose housing has been omitted for the clarity of the drawing, and the associated rail.
Figure 4:
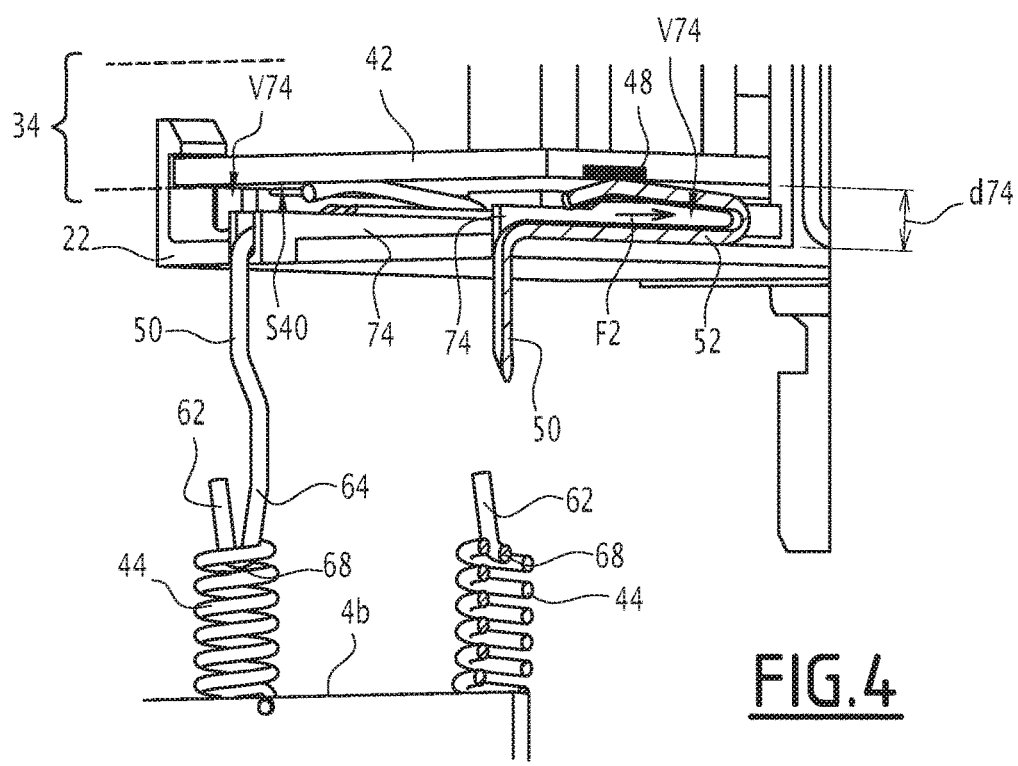
FIG. 4 is a larger scale view of certain parts corresponding to the detail D in FIG. 3, seen from another angle, the object of FIG. 3 being cut along the plane IV in this figure.

Moreover, the clip 50 comprises a second portion 62 for elastically bearing against the spring 44. This second portion 62 comprises two branches 64 and 66 linked by a bend 68 which is partially engaged in the spring 44, as can be seen in FIGS. 3 and 4, in the assembled configuration of the contactor 2.

In this configuration, the second portion 62 of the clip 50 is in elastic mechanical contact and in direct electrical contact with the spring 44.

The clip 50 also comprises a third portion 72 which links the first and second portions 52 and 62 to one another. This third portion 72 is of globally elongate and wavy form, with two parallel branches 73 and 74 linked by a branch 75 not parallel to the branches 73 and 74.

A globally right-angled bend 78 links the first and third portions 72. Thus, the second and third portions 62 and 72 are globally at right angles to the first portion 52.

The branch 73 prolongs the branch 64, whereas the branch 74 is connected to the bend 78.

As emerges from FIG. 4, the housing 22 defines two hollow rails 74 whose internal volume V74 is configured to receive and guide the first portion 52 of a clip 50 parallel to the length L52 of this portion measured between the bends 58 and 78. Thus, the first portion 52 of a clip 50 can be engaged in the volume V74 of a rail 74 by sliding in the direction of the arrow F2 in FIG. 4.

The geometry of the volume V74 can be designed such that, when the bend 78 comes to bear against the edge of the rail 74, the outermost part of the branch 56 is in electrical contact with the ground terminal 48 situated facing it. The distance between the bottom of the volume V74 of a rail 74 and the facing surface S40 of the printed circuit board 40 is denoted d74. The maximum distance between the opposite sides of the branches 54 and 56 without stress, that is to say when the clip 50 is situated outside the housing 22, it is denoted d52. The distance d52 is chosen to be strictly greater than the distance d74, which guarantees a good electrical contact between the branch 56 and the ground terminal 48 when the first portion 52 of the clip 50 is in place in the volume V74.

Moreover, the length L74 of the clip 50 measured between the bends 68 and 78 is chosen such that, when the first portion 52 is in place in the volume V74, the bend 78 is engaged in and in contact with the adjacent spring 44. The distance d52 and the length L74 are measured parallel to one another.

The geometry of the clip 50 allows it also to take up the manufacturing tolerances and the dimensional variations which could have an influence on the relative positioning of the parts 44 and 48 and on the electrical contacts at the portions 52 and 62. Thus, the electrical contact between the parts 44 and 48, established by the clip 50, is of lasting quality in a series of contactors 2 and stable in time.

The clip 50 makes it possible to electrically connect the parts 44 and 48 permanently, that is to say whatever the position of the spring 44 relative to the rail 4, from the moment that the device 2 is mounted on the rail 4.

Figure 6:
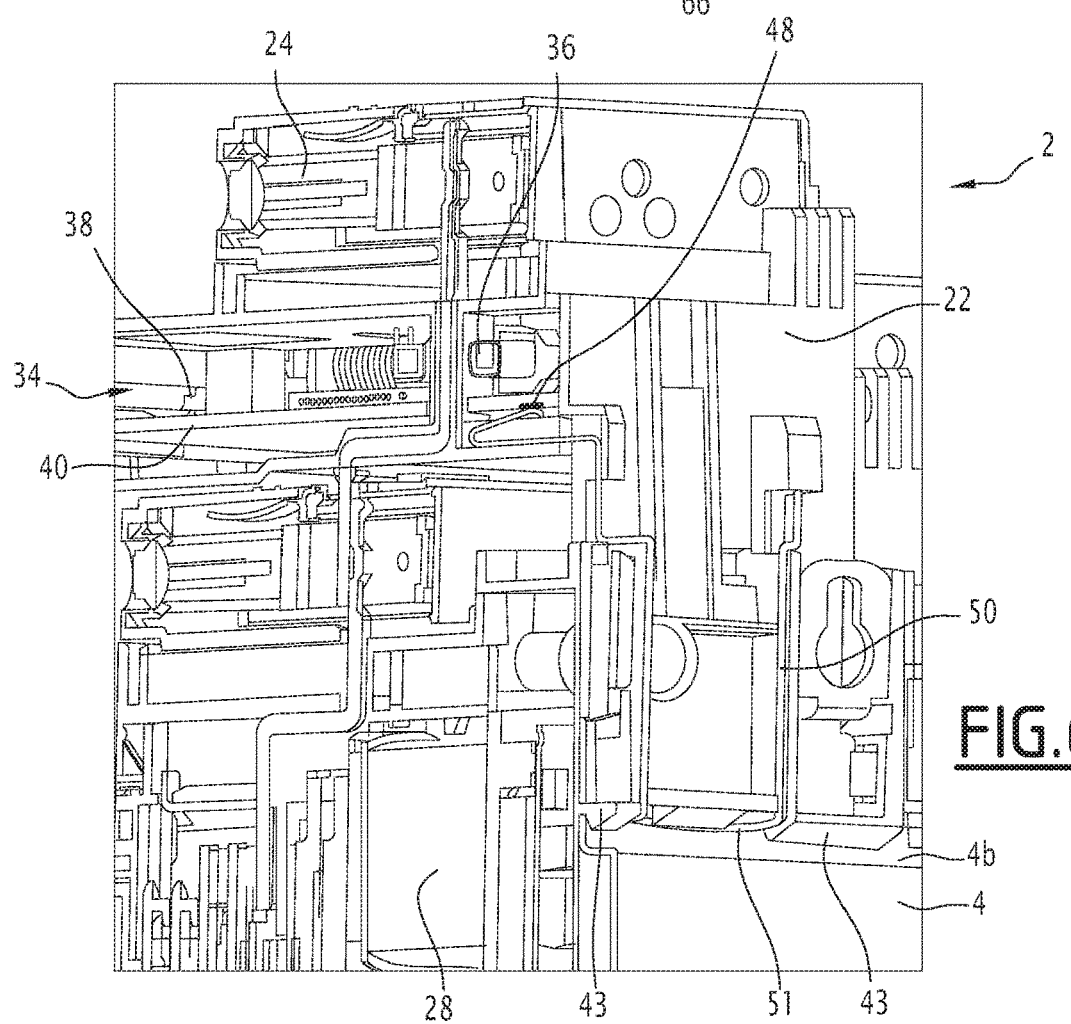
FIG. 6 is a perspective cross-section of another contactor of the installation of FIG. 1, along the plane VI in FIG. 1.
Figure 7:
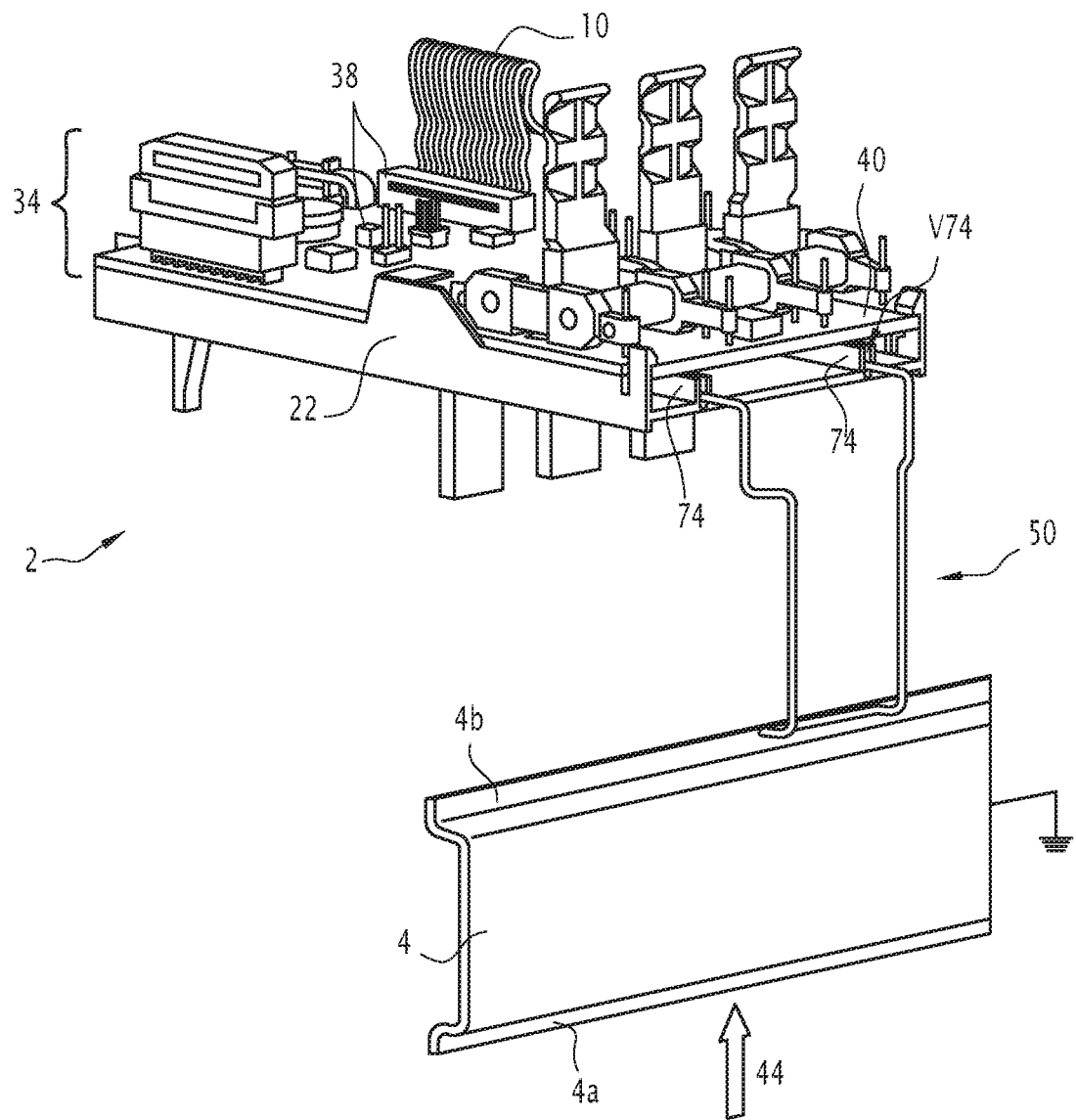
FIG. 7 is a perspective view from the rear of certain parts of the contactor of FIG. 6 and of the associated rail.
Figure 8:
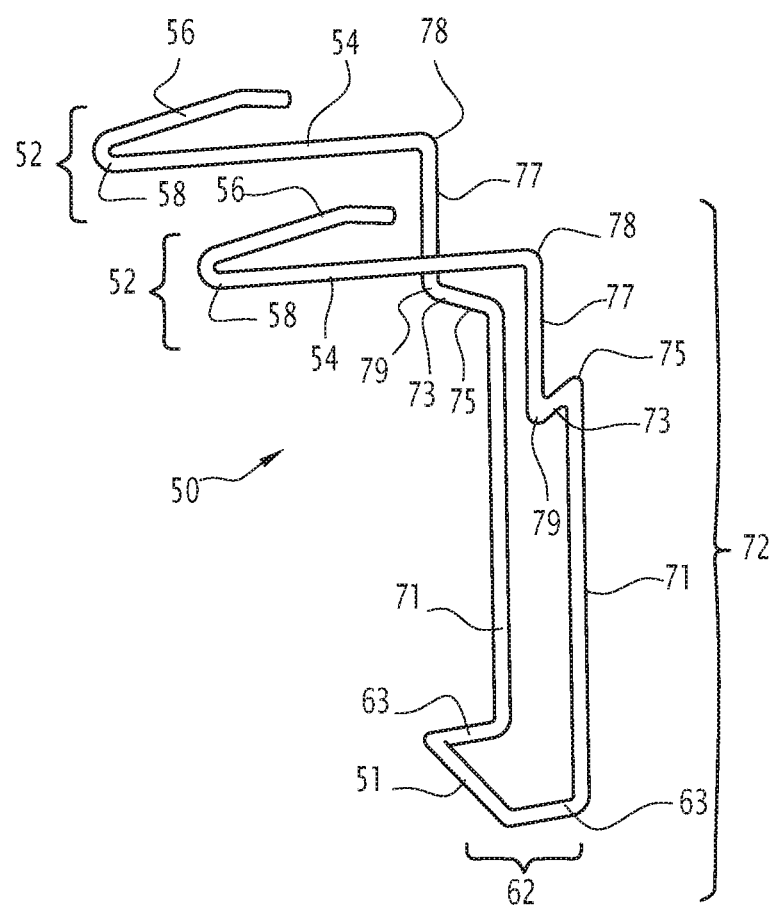
FIG. 8 is a perspective view of an electrical connecting member used in the contactor of FIGS. 6 and 7.

In the second embodiment of the invention represented in FIGS. 6 to 8, the elements that are similar to those of the first embodiment bear the same references. Hereinbelow, it is primarily what distinguishes this embodiment from the preceding one that is to be described.

In this embodiment, the housing 22 of the contactor 2 is immobilized on the rail 4 by means of an elastic clip 50 which comprises a bar 51 intended to come to bear directly mechanically elastically with the second top edge 4*b* of the rail 4, by being parallel to this edge. This bar 51 forms a member bearing elastically on and making electrical contact with the clip 50 on the rail 4.

One or more elastic members, comparable to the springs 44 of the first embodiment or produced in the form of drawers that are mobile transversely to a longitudinal axis of the rail 4, are provided to snap-fit the body 22 onto the rail 4. These elastic members are not visible in FIG. 6 because they are situated below the bottom limit of this figure. In FIG. 7, the arrow 44 represents the position of one of these elastic members. Thus, the clip 50 does not constitute, on its own, an elastic blocking member for elastically blocking the housing 22 on the rail 4, even though it does contribute to this blocking.

The bar 51 is arranged, along the rail 4, between two hooks 43 for retaining the body 22 on the rail 4, these hooks being formed by the body 22 on the back thereof. These hooks also come to bear against, or at the very least facing, the second top edge 4*b*.

These similar hooks 43 are comparable to the hook 42 of the first embodiment.

In this embodiment, the clip 50 comprises two first portions 52 whose geometry is comparable to the first portion 52 of the clip 50 of the first embodiment, each with a first branch 54, a second branch 56 and a bend 58.

The second branch 56 of each first portion comes to bear against a ground terminal 48 of a printed circuit board 40 which belongs to a monitoring and/or control module 34 comparable to that of the first embodiment and which also supports a Rogowski torus 36.

Rails 74 for receiving the first portions 52 are provided, with the same geometry as in the first embodiment.

The clip 50 of this second embodiment also comprises a second portion 62 which includes, in addition to the bar 51, two branches 63 at right angles to this bar and which extend on the same side thereof, from its ends. This second portion comes to bear against, therefore in electrical contact with, the rail 4.

Moreover, a third portion 72 of the clip 50 in this embodiment links the two portions 52 and the second portion 62 to one another. This third portion 72 comprises two branches 71 at right angles to the bar 51 and to the branches 63, two branches 73 linked to the branches 71 by right-angled bends 75 and two branches 77 linked to the branches 73 by right-angled bends 79. The branches 77 are parallel to and laterally offset with respect to the branches 71.

Right-angled bends 78 link the branches 77 to the two first portions 52 of this clip 50.

One important difference between this second embodiment and the preceding one is that, in this case, the clip 50 does not ensure a function of elastically blocking the body 22 on the rail 4, or at least not on its own, because of the hooks 43 and those represented by the arrow 44 in FIG. 7. By the fact that it bears elastically against the rail 4b, by virtue of the bar 51, the clip 50 is making strong electrical contact with this rail. In the configuration in which the device 2 is mounted on the rail 4, it ensures a permanent electrical link function, by virtue of the parts 52 to 79, between the ground terminals of the board 40 and the rail 4.

Furthermore, in this embodiment, a single clip 50 makes it possible to link two ground terminals, similar to the ground terminals 48 of the first embodiment, with the rail 4.

Whatever the embodiment, the simple act of mounting the contactor 2 on the rail 4 results in the permanent grounding of the terminals 48 of the printed circuit board 40, whether this grounding takes place via an elastic blocking member such as a spiral spring, like the spring 44 of the first embodiment, or directly by the contact of the clip 50 itself with the rail 4, as in the second embodiment.

Whatever the embodiment, the fact that the clip 50 is produced by conforming a semi-rigid metal wire allows this connecting element to run in confined spaces, that is to say in a constrained environment, without compromising the compactness of the electrical device 2.

The invention is presented above for an application in the context of a contactor. It is however applicable to other electrical devices intended to be mounted on a rail, which comprise a monitoring and/or control module, in particular to a measurement module, such as those represented as third and fourth devices 2 starting from the left in FIG. 1, to a circuit breaker or another control and protection device.

The rail 4 can conform to one or more standards other than DIN.

The embodiments and variants envisaged above can be combined with one another to create new embodiments of the invention.

The invention claimed is:
1. An electrical device comprising:
a housing that is intended to be mounted on a rail;
a monitoring and/or control module including a printed circuit board,
wherein, in the configuration in which the electrical device is mounted on the rail, at least one ground terminal of the printed circuit board is permanently electrically connected to the rail by elastic mechanical bearing on and direct electrical contact with a connecting element, itself elastically mechanically bearing on and making direct electrical contact with an elastic blocking member for elastically blocking the housing on the rail,
wherein the elastic blocking member is a spiral spring provided to come to bear against the rail and wherein the electrical connecting element is a conductive clip bearing, on the one hand, on the ground terminal and, on the other hand, on the spiral spring.

2. The electrical device according to claim 1, wherein the connecting element between the ground terminal of the printed circuit board and the rail is a semi-rigid conductive clip composed of a metal wire conformed to electrically link said terminal and said rail.

3. The electrical device according to claim 2, wherein the semi-rigid conductive clip comprises a first portion elastically bearing against the ground terminal of the printed circuit board, said first portion comprising two branches which extend from a joining bend.

4. The electrical device according to claim 3, wherein the conductive clip comprises a second portion elastically bearing on the spiral spring, wherein said second portion comprises two branches which extend from a joining bend.

5. The electrical device according to claim 2, wherein the conductive clip is produced in a bronze wire, with a cross section whose area lies between 0.5 and 4 $mm^2$.

6. The electrical device according to claim 1, wherein the conductive clip is of a single piece and conformed to electrically link the ground terminal of the printed circuit board and the spiral spring.

7. An electrical device comprising:
a housing that is intended to be mounted on a rail;
a monitoring and/or control module including a printed circuit board,
wherein, in the configuration in which the electrical device is mounted on the rail, at least one ground terminal of the printed circuit board is permanently electrically connected to the rail by elastic mechanical bearing on and direct electrical contact with a connecting element, itself elastically mechanically bearing on and making direct electrical contact with the rail or with an elastic blocking member for elastically blocking the housing on the rail,
wherein the connecting element between the ground terminal of the printed circuit board and the rail is a semi-rigid conductive clip composed of a metal wire conformed to electrically link said terminal and said rail,
wherein the semi-rigid conductive clip comprises a first portion elastically bearing against the ground terminal of the printed circuit board, said first portion comprising two branches which extend from a joining bend, and
wherein the first elastic bearing portion is received and guided, parallel to its length, in a receptacle defined between the housing and the printed circuit board.

8. A method for earthing a printed circuit board of a monitoring and/or control module of an electrical device comprising a housing that is intended to be mounted on a rail, wherein the earthing is effected simply by mounting the housing on the rail.

9. An electrical device comprising:
a housing that is intended to be mounted on a rail;
a monitoring and/or control module including a printed circuit board,
wherein, in the configuration in which the electrical device is mounted on the rail, at least one ground terminal of the printed circuit board is permanently electrically connected to the rail by elastic mechanical bearing on and direct electrical contact with a connecting element, itself elastically mechanically bearing on and making direct electrical contact with the rail wherein said electrical connecting element is a semi-rigid conductive clip composed of a single-piece semi-rigid metal wire which comprises:

two first portions, parallel to each other and bearing against the ground terminal of the printed circuit board;

a second portion bearing directly on the rail;

a third portion, including two parallel branches connected to each of the two first portions, providing the link between the first and second portions, wherein the second portion connects the two parallel branches of the third portion.

* * * * *